(12) United States Patent
Cignoli et al.

(10) Patent No.: US 11,923,770 B2
(45) Date of Patent: Mar. 5, 2024

(54) CURRENT SENSING IN SWITCHED ELECTRONIC DEVICES

(71) Applicant: STMICROELECTRONICS S.r.l., Agrate Brianza (IT)

(72) Inventors: Marco Cignoli, Pavia (IT); Vanni Poletto, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/959,797

(22) Filed: Oct. 4, 2022

(65) Prior Publication Data

US 2023/0117101 A1 Apr. 20, 2023

(30) Foreign Application Priority Data

Oct. 20, 2021 (IT) .................. 102021000026972

(51) Int. Cl.
| | |
|---|---|
| *H02M 3/155* | (2006.01) |
| *B60L 3/12* | (2006.01) |
| *G01R 19/10* | (2006.01) |
| *H02M 1/08* | (2006.01) |

(52) U.S. Cl.
CPC ............ *H02M 3/155* (2013.01); *B60L 3/12* (2013.01); *G01R 19/10* (2013.01); *H02M 1/08* (2013.01)

(58) Field of Classification Search
None
See application file for complete search history.

(56) References Cited

U.S. PATENT DOCUMENTS

| | | | |
|---|---|---|---|
| 7,960,997 B2* | 6/2011 | Williams | ............ H01L 29/7833 |
| | | | 324/762.09 |
| 10,168,363 B1 | 1/2019 | Petenyi | |
| 2002/0024376 A1 | 2/2002 | Sander | |
| 2015/0192642 A1 | 7/2015 | Bashar | |

* cited by examiner

*Primary Examiner* — Jeffery S Zweizig
(74) *Attorney, Agent, or Firm* — Seed IP Law Group LLP

(57) ABSTRACT

Provided is a circuit including a switching transistor having a control terminal configured to receive a control signal and having a current flow path therethrough. The switching transistor becomes conductive in response to the control signal having a first value. The current flow path through the switching transistor provides a current flow line between two nodes. In a non-conductive state, a voltage drop stress is across the switching transistor. The circuit comprises a sense transistor that is coupled to and a scaled replica of the switching transistor. The sense transistor has a sense current therethrough. The sense current is indicative of the current of the switching transistor. The circuit includes coupling circuitry configured to apply the voltage drop stress across the sense transistor in response to the switching transistor being non-conductive. In the non-conductive state, the voltage drop stress is replicated across both the switching transistor and the sense transistor.

20 Claims, 10 Drawing Sheets

CURRENT SENSING IN SWITCHED ELECTRONIC DEVICES

BACKGROUND

Technical Field

This disclosure relates to circuits for sensing currents. For instance, one or more embodiments may be applied in measuring a current flowing through an inductive load in an electronic device, such as, e.g., a switched (or switching) converter.

One or more embodiments may be used in applications where, as is the case in the automotive field, for instance, preserving accuracy in operation over the lifetime of an electronic device is a desirable feature.

Description of the Related Art

Power field-effect transistors (FETs) are currently used in matched sense/power structures.

In that context, accurate sensing of a current in an inductive load of a switched converter circuit may involve a sense transistor that is a down-sized replica of a (e.g., high/low-side) power transistor of the switched converter.

Current sensing can thus exploit a precise relationship between the parameters of the sense transistor and the power transistor, e.g., same on-resistance value or a certain ratio between respective on-resistance values.

Power transistor structures can be subject to stress conditions during mission profiles: a mission profile describes the loads and stresses to which a product is exposed in actual use.

Changes in temperature, temperature profile, vibration and working of electrical and mechanical fields, or other environmental factors are exemplary of such loads and stresses.

These conditions can lead to degradation of electrical parameters in the power transistor (that is, aging of the values of these electrical parameters over time).

This may be due to various phenomena such as, for instance, high-temperature reverse bias (briefly, HTRB) and hot carrier injection (briefly, HCI), that exhibit different (sometimes even contrasting) behaviors in terms of temperature, current and voltage applied profiles, for instance.

Aging of parameters in the power transistor failing to be mirrored in the associated sense transistor may result, e.g., in on-resistance Ron ratio mismatch, threshold voltage Vth mismatch between the power transistor and the sense transistor, which in turn lead to a loss of accuracy in current sensing.

This may represent a (highly) undesirable consequence, especially for power circuitry mounted onboard automotive vehicles.

BRIEF SUMMARY

One or more embodiments propose a circuit comprising at least one power switch having an associated sense transistor, the power switch configured to have a current flow therethrough during a first time interval and subject to electrical stress during a second time interval, wherein the circuit comprises coupling circuitry configured to apply such electrical stress (also) to the sense transistor during the second time interval as well as during the first time interval may be exemplary of such a circuit.

One or more embodiments may relate to a corresponding switched electronic converter (e.g., equipped on-board a telematic control unit of a vehicle).

A converter circuit comprising at least one pair of matched power/sense transistors (e.g., n-MOSFETs) may be exemplary of such a circuit.

One or more embodiments facilitate obtaining a ratio between the on-resistance values Ron stable over time and that does not undergo variations due to the aging of a converter device.

One or more embodiments facilitate obtaining a very high current accuracy performance in current controlled PWM drivers during the lifetime of the system.

One or more embodiments may improve silicon area occupancy, e.g., by reducing their impact thereon.

One or more embodiments facilitate relaxing automotive design constraints, correspondingly increasing gross margins in automotive applications.

One or more embodiments may exploit relatively simple and cost-effective arrangements, e.g., a diode and a switch.

In one or more embodiments, the sensitivity from HCI and HTRB phenomena in HV matched sense/power structures due to different voltage and/or current profiles applied during lifetime of the system may be reduced.

In one or more embodiments, mismatches between the sense/power current mirrors during PWM activity can be by-passed, e.g., using a diode and switches in the current sense architecture.

One or more embodiments may produce a negligible impact on the control system complexity and on the silicon area impact.

BRIEF DESCRIPTION OF THE SEVERAL VIEWS OF THE DRAWINGS

One or more embodiments will now be described, by way of non-limiting example only, with reference to the annexed Figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The drawings are in simplified form and are not to precise scale.

Throughout the figures like parts or elements are indicated with like references/numerals and a corresponding description will not be repeated for brevity.

The references used herein are provided merely for convenience and hence do not limit the extent of protection or the scope of the embodiments.

For the sake of simplicity, in the following detailed description a same reference symbol may be used to designate both a node/line in a circuit and a signal which may occur at that node or line.

Figure 1:
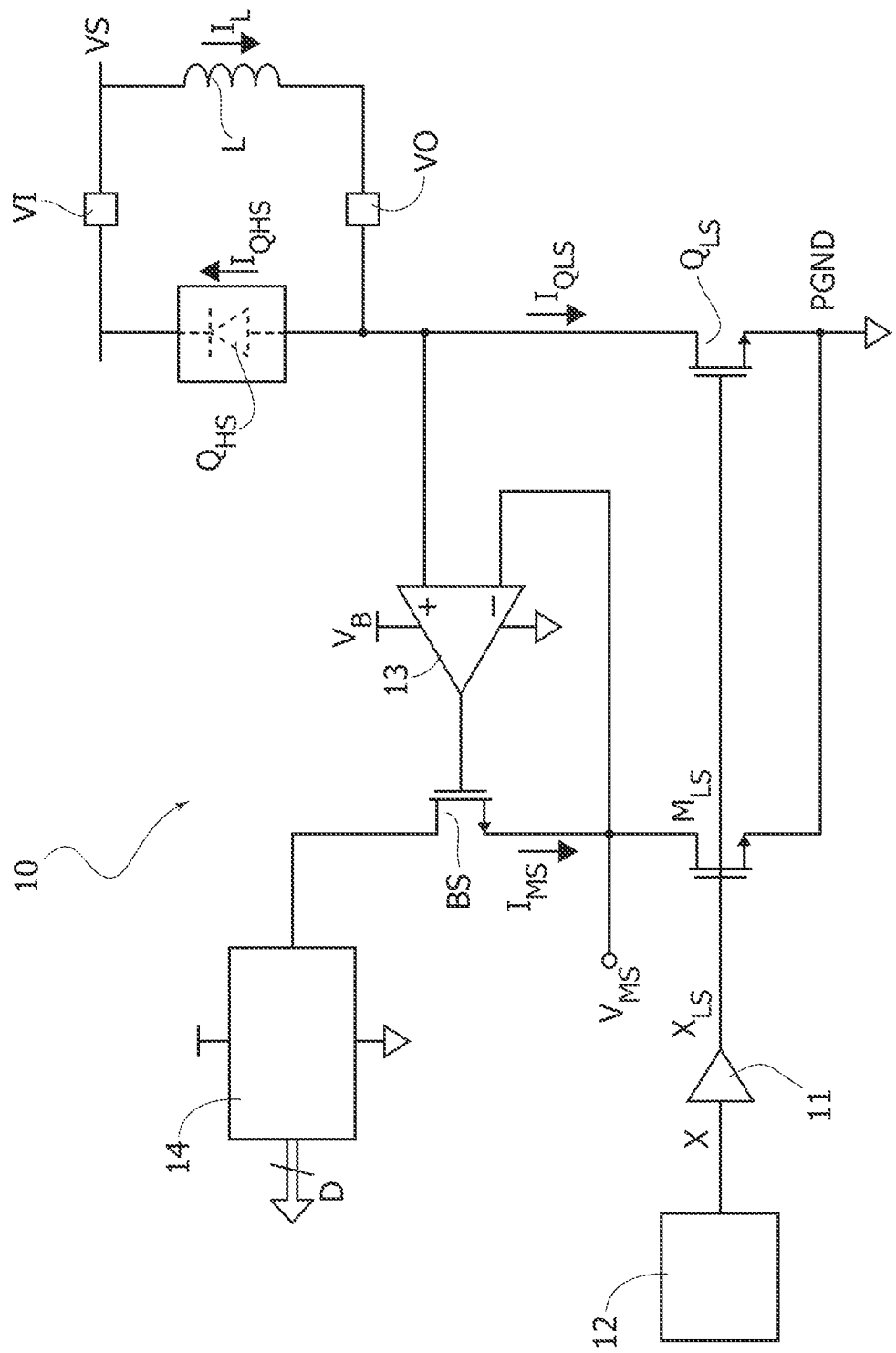
FIG. 1 is a circuit diagram exemplary of a converter circuit.

As exemplified in FIG. 1, a switched (or switching) converter circuit 10 comprises:
- a power supply node VI configured to receive a DC supply voltage (e.g., a voltage level $V_S$=12 V provided by a battery not visible in FIG. 1) referred to ground PGND,
- a first switching transistor $Q_{LS}$ (e.g., a metal-oxide-semiconductor (MOS) field-effect transistor (FET), e.g., n-channel or p-channel MOSFET) and a second switching transistor $Q_{HS}$ (e.g., a FET used as a recirculating diode), the switching transistors $Q_{LS}$, $Q_{HS}$ coupled therebetween (e.g., drain node VO of the first switching transistor $Q_{LS}$ connected to anode of the recirculating diode $Q_{HS}$) and having respective current paths therethrough arranged in series between the input node VI and ground PGND, via a switching node VO intermediate the first $Q_{LS}$ and second $Q_{HS}$ switching transistors, the switching node VO configured to be coupled to a load referred to a reference voltage (e.g., ground or VI) to provide a output voltage thereto,
- an inductive component L, such as a coil inductor with inductance L and resistance R, having one end coupled (e.g., directly) to the switching node VO and another end coupled to the power supply node VI.

For the sake of simplicity, principles underlying one or more embodiments are discussed in the following mainly with reference to an arrangement of the inductive component L coupled between the switching node VO and the power supply node VI, being otherwise understood that this is purely exemplary and in no way limiting.

For instance, in an alternative case the inductive load L is coupled between the switching node VO and ground while the load $Z_L$ is coupled between the input node VI and to the output node VO.

As exemplified in FIG. 1, the switched converter 10 further comprises a (e.g., low-side) driver 11 coupled to the control node of the first $Q_{LS}$ transistor, the driver 11 configured to provide a control/drive signals $X_{LS}$ to the control node of the first switching transistor $Q_{LS}$.

As exemplified in FIGS. 1, the driver signal $X_{LS}$ is based on a control signal X received from a control circuit 12 configured to operate the converter circuit 10, for instance a pulse-width modulated (briefly, PWM) control signal X, produced in a manner known per se.

In one or more alternative cases, the driver circuit 11 is configured to produce directly the first control signal $X_{LS}$ to the driver circuit 11 for switching the first switching transistor $Q_{LS}$ between a first (e.g., conductive or ON) state and a second (e.g., non-conductive or OFF) state.

As exemplified in FIG. 1, the converter 10 further comprises a sense transistor $M_{LS}$ associated to the first switching transistor $Q_{LS}$ and having a common control node therewith, the sense transistor $M_{LS}$ having a current flow path therethrough between a first (e.g., drain) sense node $V_{MS}$ and a second (e.g., source) node coupled to ground PGND and common with a corresponding node of the transistor $Q_{LS}$.

In one or more cases as exemplified in FIG. 1, the sense transistor $M_{LS}$ is a down-scaled replica of the first switching transistor $Q_{LS}$. For instance, the sense transistor $M_{LS}$ comprises a respective junction area which is a fraction of (e.g., 1/N times) of the junction area of the first switching transistor Qs associated therewith.

As exemplified in FIG. 1, the circuit 10 further comprises a buffer circuit 13, BS, such as an op-amp voltage follower known per se, comprising an (e.g., operational) amplifier circuit 13 having a respective first (e.g., non-inverting) input node coupled to the switching node VO, a second (e.g., inverting) input node coupled to the first sense node $V_{MS}$ of the sense transistor $M_{LS}$ and an output node coupled to a buffer switch BS, the buffer circuit 13 configured to impose at its output node an output voltage replicating the voltage at its first input node.

As exemplified in FIG. 1, the buffer circuit 13, BS is biased at a bias voltage $V_B$ lower than the power supply voltage level VI (e.g., $V_B$=5 V and $V_S$=12 V). As a result, in case the first input node of the buffer arrangement 13, BS floats at an open voltage, a maximum voltage level that can be replicated at the output node of the buffer circuit 13, BS is limited to the bias voltage level $V_B$.

Figure 2:
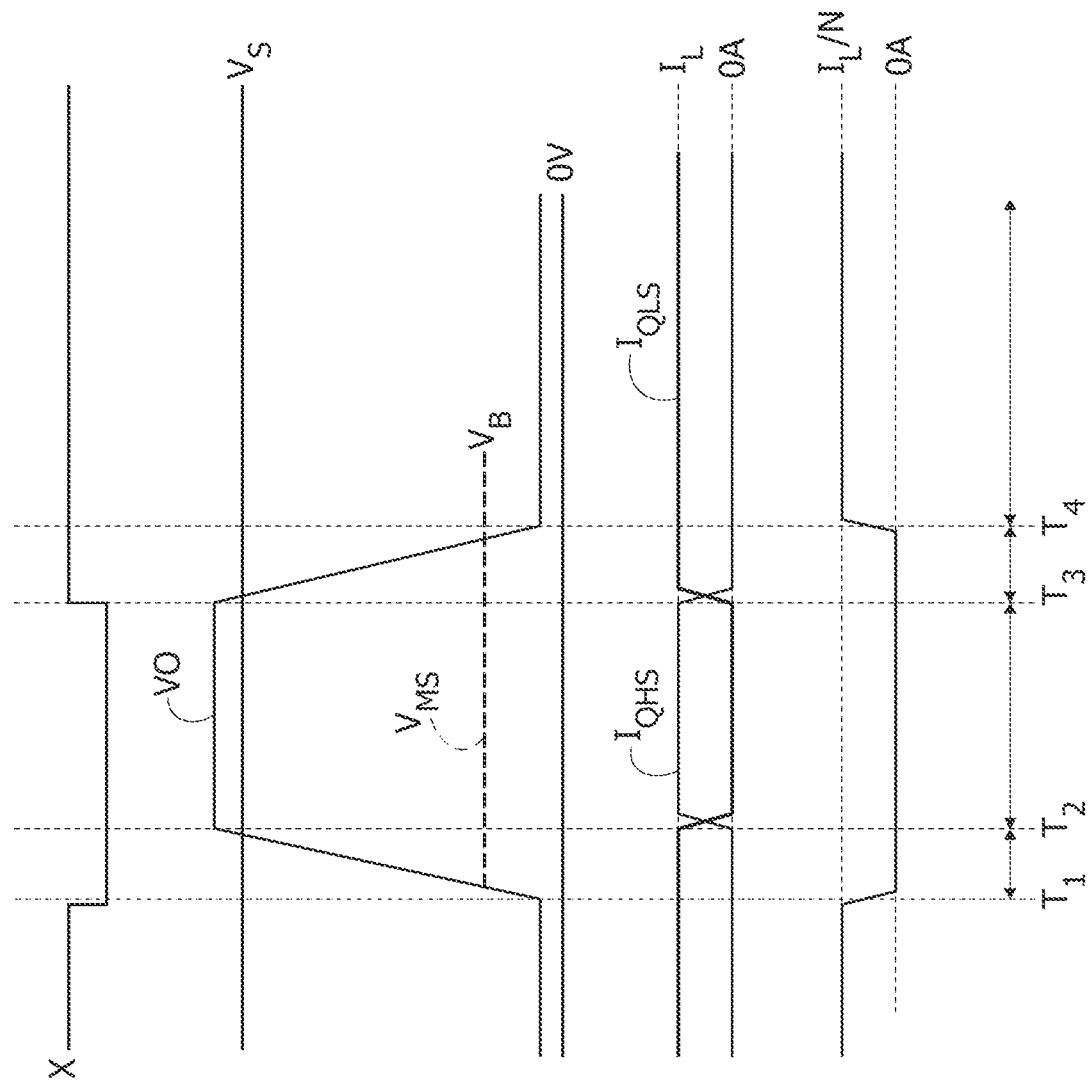
FIG. 2 is a time diagram of signals of the converter circuit of FIG. 1.

As exemplified in FIG. 2, in an initial condition before a first time instant $T_1$, the control signal X provided to drive circuit 11 has a first value (e.g., a voltage level above the gate-source threshold $V_{GS}$ of the switching $Q_{LS}$ transistor, such as 5 V) so that the switching transistor $Q_{LS}$ is in the ON state and has a current $I_{QLS}$ steadily flowing therethrough, the current $I_{QLS}$ being equal to that flowing through the inductive component L (e.g., $I_{QLS}$=$I_L$).

As exemplified in FIG. 2, still in the initial condition before the first time instant $T_1$, a sense current $I_{MS}$ that is a down-scaled replica of the current $I_{QLS}$ in the first switching transistor $Q_{LS}$ steadily flows in the associated sense transistor $M_{LS}$ (e.g., $I_{MS}$=$I_{QLS}$/N=$I_L$/N).

As exemplified in FIGS. 1 and 2, still in this initial phase before the first time instant $T_1$, the buffer circuit 13, BS keeps the sense node $V_{MS}$ of the sense transistor $M_{LS}$ at a voltage level equal to the one at the switching node VO, e.g., at VO=0.7 V.

As exemplified in FIG. 2, in such exemplary initial condition before the first time instant $T_1$, both the switching transistor $Q_{LS}$ and the associated sense transistor $M_{LS}$ experience same electrical operating conditions and voltage drop stresses across their terminals.

As exemplified in FIG. 1, the buffer circuit 13 is optionally coupled to an analog-to-digital (briefly, A/D) converter 14 configured to digitize the sensing current signal $I_{MS}$ flowing in the first sense transistor $M_{LS}$.

For instance, the A/D converters 14A, 14B provides a digital signal D indicative of the current $I_{MS}$ flowing in the switching transistors $Q_{LS}$ in the initial phase, which is indicative of the intensity of the current in the coil L. For instance, this digital signal D may be fed back to the control circuit 12 to create a feedback loop to adjust the control signal accordingly, for instance, in ways per se known.

It is noted that an act of digitizing the sensing current $I_{MS}$ is purely exemplary and in no way limiting. For instance, hybrid digital/analog or purely analog circuitry suitable to process sense current signal $I_{MS}$ may be coupled to the sense transistor $M_{LS}$.

As exemplified in FIG. 2, at the first time instant $T_1$, the control signal X is asserted with the second value (e.g., X=0 V); in response to this, the switching transistor $Q_{LS}$ begins a transition from the turned-on state to the turned-off state, reaching the latter at time instant t2.

As exemplified in FIG. 2, during the on-off state transition in time interval $T_1$-$T_2$, the current flow path through the switching transistor $Q_{LS}$ is made non-conductive so that the first current value $I_{QLS}$ decreases from the coil current value $I_L$ towards zero, while the second current value $I_{QHS}$ in the recirculating diode $Q_{HS}$ grows from zero towards the coil current value $I_L$.

As exemplified in FIGS. 1 and 2, as a result of the current $I_{QLS}$ going to zero, the input node of the buffer stage 13, BS remains floating and applies to the sense transistor $M_{LS}$ a voltage limited by its biasing voltage level (e.g., $V_B$=5 V) while the voltage across the switching transistor $Q_{LS}$ is the switching node VO (e.g., VO=VS+0.7V).

As exemplified in FIG. 2, the sense current $I_{MS}$ goes to zero as a result of the buffer 13, BS not being capable of tracking output voltage VO at a voltage level higher than the bias voltage $V_B$ during the on-off transition taking place in time interval T1-$T_2$, for instance.

As exemplified in FIG. 2, HCI phenomena impacts differently the switching transistor $Q_{LS}$ and the sense transistor $M_{LS}$ over time due to each component experiencing different operating conditions and corresponding electrical stimuli.

As exemplified in FIG. 2, at the second time instant $T_2$ the switching transistor $Q_{LS}$ reaches a stationary OFF state and remains turned-off as long as the control signal X has the second value (e.g., X=0 V), that is until a third time instant $T_3$ at which the control signal X is asserted with the first value (e.g., X=5 V).

As exemplified in FIG. 2, during the stationary phase $T_2$-$T_3$, the current signal $I_{QLS}$ in the switching transistor $Q_{LS}$ is zero while the current $I_L$ flowing in the inductive load L pulls the voltage at the switching node VO above the power supply voltage level $V_S$ by an amount equal to the voltage drop $V_{QHS}$ across the diode $Q_{HS}$, e.g., 12.7 Volts.

As exemplified in FIG. 2, during the stationary phase $T_2$-$T_3$ the sense node $V_{MS}$ of the sense transistor $M_{LS}$ floats in high impedance around the bias voltage $V_B$, e.g., due to the limited voltage rating of the buffer arrangement 13, BS.

As exemplified in FIG. 2, due to the different voltage stresses VO, $V_{MS}$ are still experienced by the two transistors $Q_{LS}$, $M_{LS}$ during the steady state time interval $T_2$-$T_3$; again, these produce an unbalance in HTRB phenomena affecting the two electrical components, leading to undesirable mismatches therebetween.

As exemplified in FIG. 2, at the third time interval $T_3$ the control signal $X_{LS}$ is asserted with the first value, so that the switching transistor $Q_{LS}$ begins an inverted transition from the OFF state to the ON state, producing mirror symmetrical operating conditions with respect to those discussed with respect to the transition in time interval $T_1$-$T_2$.

As exemplified in FIGS. 1 and 2, the different electrical stresses applied to the switching transistor $Q_{LS}$ and the associated sense transistor $M_{LS}$ of the circuit 10 as exemplified in FIG. 1 in different operating conditions may lead to a degradation of the capability of the sense transistor $M_{LS}$ to accurately replicate the current in the switching transistor $Q_{LS}$, consequently reducing accuracy of the current sensing signal D.

HCI and HTRB degradations in power transistors can be highly relevant for braking and transmission applications in vehicles, where less than 1% of current error is tolerated with respect to a setpoint after lifetime cycle.

Figure 3:
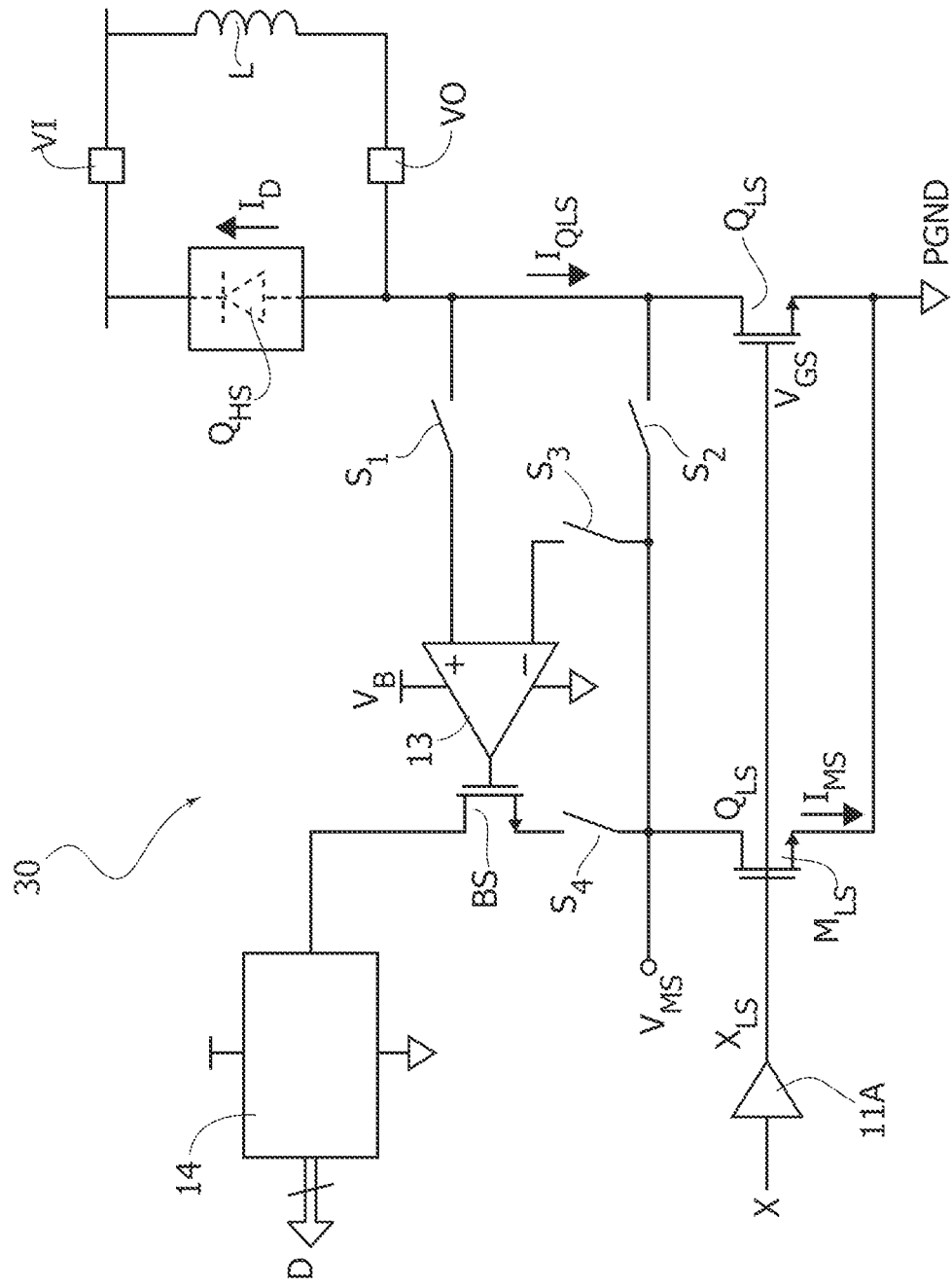
FIG. 3 is a circuit diagram exemplary of one or more embodiments.

As exemplified in FIG. 3, an improved converter circuit 30 as per the present disclosure comprises coupling circuitry 13, BS, $S_1$, $S_2$, $S_3$, $S_4$ of the sense transistor $M_{LS}$ to the least one switching transistor $Q_{LS}$, the coupling circuitry 13, BS, $S_1$, $S_2$, $S_3$, $S_4$ configured to apply a voltage drop stress across the sense transistor $M_{LS}$ in response to the at least one switching transistor $Q_{LS}$ being switched towards said OFF state, wherein, in response to the at least one switching transistor $Q_{LS}$ being switched towards said OFF state, said voltage drop stress is replicated across both the at least one switching transistor $Q_{LS}$ and across the sense transistor $M_{LS}$.

As exemplified in FIG. 3, the coupling circuitry 13, BS, $S_1$, $S_2$, $S_3$, $S_4$ comprises the buffer arrangement 13, BS and a set of switches $S_1$, $S_2$, $S_3$, $S_4$ (e.g., implemented using MOS transistors, diodes or back-to-back switches, known per se).

For the sake of simplicity, principles underlying one or more embodiments are discussed in the following mainly with reference to a notional drive signal S used to operate switches in the set of switches $S_1$, $S_2$, $S_3$, $S_4$.

In one or more embodiments, such a drive signal S may be obtained based on other signals and be entirely optional. For instance, the drive signal S may be obtained based on the control signals $X_{LS}$, $X_{HS}$. As exemplified herein, in a purely exemplary and non-limiting scenario, for instance, the drive signal S can be obtained via logical circuitry as a logical combination of control signals $X_{LS}$, $X_{HS}$, optionally together with a monitor signal (e.g., produced via optional comparison circuitry, in a manner known per se) indicative of a voltage level being above or below a certain threshold either at the output node VO or at the control node of at least one switching transistor $Q_{LS}$, $Q_{HS}$.

For instance, the set of switches $S_1$, $S_2$, $S_3$, $S_4$ comprises:
a first subset of switches $S_1$, $S_3$, $S_4$ configured to be made conductive to couple the input node of the amplifier 13 to the sense node $V_{MS}$ the first sensing transistor $M_S$ when driven to be in a first (e.g., ON) state (e.g., in response to a respective drive signal S having a first value) and to be made non-conductive to decouple the input node of the amplifier 13 from the sense node $V_{MS}$ of the first sensing transistor MS when driven to be in a second (e.g., OFF) state (e.g., in response to a respective drive signal S having a first value), as discussed in the following, and
a second subset of switches $S_2$ configured to be made conductive to couple the sense node $V_{MS}$ of the sense transistor $M_{LS}$ and the switching node VO of the first switching transistor $Q_{LS}$ when driven to be in the first (e.g., ON) state (e.g., in response to the respective drive signal S having the second value) and to be made non-conductive to decouple the sense node $V_{MS}$ of the sense transistor $M_{LS}$ and the switching node VO of the first switching transistor $Q_{LS}$ when driven to be in a second (e.g., OFF) state (e.g., in response to the respective drive signal S having the first value).

As exemplified in FIG. 3, the second subset of switches $S_1$, $S_3$, $S_4$ comprises:

a first switch $S_1$ configured to selectively couple or decouple the switching node VO and the first (e.g., non-inverting) input node of the amplifier 13, a third switch $S_3$ configured to selectively couple the sense node $V_{MS}$ (e.g., the drain node) of the first sensing transistor MS and the second (e.g., inverting) input node of the amplifier 13, and a fourth switch $S_4$ configured to selectively couple the sense node $V_{MS}$ of the first sensing transistor MS and the output node of the amplifier 13 via the switch BS.

As exemplified in FIG. 3, the second subset of switches may consist of a second switch $S_2$ configured to selectively couple the output node VO with the (e.g., drain) sense node $V_{MS}$ of the first sensing transistor $M_{LS}$.

In one or more embodiments, an arrangement 30 as exemplified in FIG. 3 facilitates preventing mismatches, evening out any unbalance of voltage drop stress between the first switching transistor $Q_{LS}$ and corresponding sensing $M_S$ transistors in any operating condition (e.g., off state, on state and state transitions).

Figure 4:
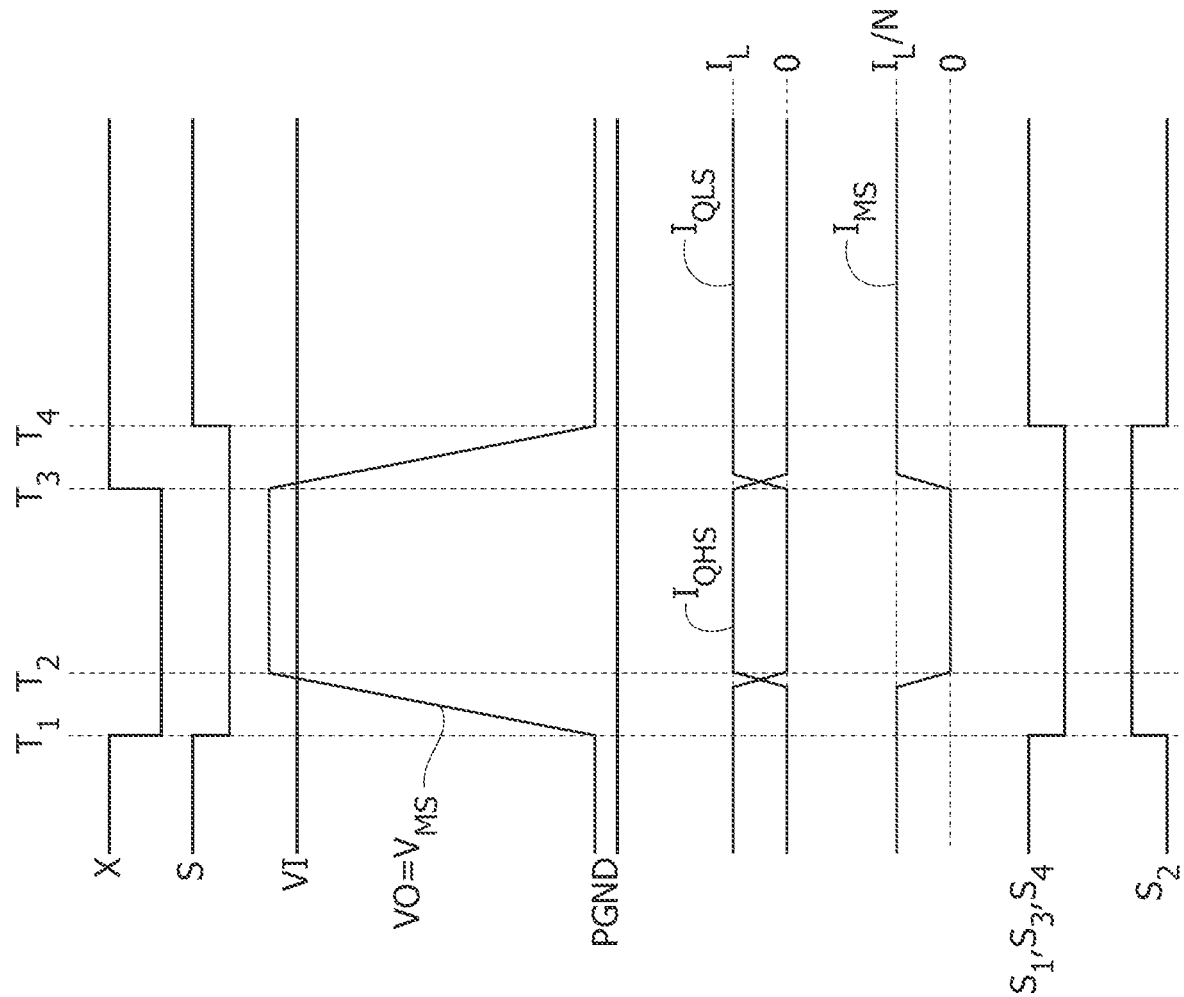
FIG. 4 is a time diagram of signals in one or more embodiments.

As exemplified in FIGS. 3 and 4, thanks to the coupling circuitry, the sense current $I_{MS}$ through the sense transistor $M_{LS}$ mirrors (with a mirroring ratio 1/N) the corresponding current $I_{QLS}$ flowing in the first switching transistor $Q_{LS}$. As a result, for instance, the voltage $V_{MS}$ detected at the sense node $V_{MS}$ of the sense transistor $M_{LS}$ has an amplitude and waveform substantially equal to that of the output voltage at the switching node VO.

As exemplified in FIGS. 3 and 4, in an initial condition before $T_1$, the control signal X has a first value (e.g., a voltage level above the gate-source threshold $V_{GS}$ of the switching $Q_{LS}$ transistor, such as 5 V) so that the switching transistor $Q_{LS}$ has a current $I_{QLS}$ steadily flowing therethrough, the current $I_{QLS}$ being equal to the current flowing in the inductive component L (e.g., $I_{QLS}=I_L$); at the same time, the sense current $I_{MS}$ steadily flows in the associated sense transistor $M_{LS}$ (e.g., $I_{MS}=I_{QLS}/N=I_L/N$); in this phase, the drive signal S of the switches in the coupling circuitry 13, BS, $S_1$, $S_2$, $S_3$, $S_4$ has a first value so that the switches in the first set of switches $S_1$, $S_3$, $S_4$ are turned ON and the switches in the second subset of switches $S_2$ are turned OFF (as represented in the bottom of the FIG. 4 by representing the ON state with the first signal value and the OFF state with the second signal value); as a result, the buffer 13, BS keeps the sense node $V_{MS}$ of the sense transistor $M_{LS}$ at a voltage level equal to the one at the switching node VO.

As exemplified in FIGS. 3 and 4, at the first time instant $T_1$, the control signal X of the switching transistor is asserted with the second value (e.g., $X_{LS}=0$ V) and the drive signal S is asserted with the second value; in response to these events:

the switching transistor $Q_{LS}$ begins a transition from the turned-on state towards the turned-off state, reaching the latter at the second time instant $T_2$, and the second switch $S_2$ is turned ON while the other switches $S_1$, $S_3$, $S_4$ are turned OFF, so that the buffer 13, BS from the switching node VO and the sense node $V_{MS}$, while the sense node $V_{MS}$ becomes coupled to the switching node VO.

As exemplified in FIG. 4, during the on-off state transition in time interval $T_1$-$T_2$, a same voltage drop stress is applied across both the switching transistor $Q_{LS}$ and the associated sense transistor $M_{LS}$.

As a result, even in the different operating conditions as exemplified in FIG. 4, HCI phenomena over time impact the switching transistor $Q_{LS}$ and the sense transistor $M_{LS}$ in an equal manner.

As exemplified in FIGS. 3 and 4, at the second time instant $T_2$ the switching transistor $Q_{LS}$ reaches a stationary OFF state in which it remains as long as the control signal $X_{LS}$ has the second value (e.g., $X_{LS}=0$ V), that is until a third time instant $T_3$ at which the control signal X is asserted with the first value (e.g., $X_{LS}=5$ V).

As exemplified in FIGS. 3 and 4, during the stationary phase $T_2$-$T_3$, also the sense node $V_{MS}$ of the sense transistor is pulled at the voltage level of the switching node VO by the inductive load L, e.g., to a voltage above the power supply voltage level $V_S$ by an amount equal to the voltage drop $V_{QHS}$ across the recirculating diode $Q_{HS}$, e.g., 12.7 Volts.

As exemplified in FIG. 4, during the stationary phase $T_2$-$T_3$ the limited voltage rating of the buffer circuit 13, BS does not affect either one of the switching $Q_{LS}$ and the sense $M_S$ transistors.

One or more embodiments are thus exposed to a reduced risk (ideally, zero risk) of mismatches between the two electrical components thanks to the balanced impact over time of aging phenomena of the two components obtained via the coupling circuitry 13, BS, $S_1$, $S_2$, $S_3$, $S_4$ employed in the circuit 30.

As exemplified in FIG. 4, at the third time interval $T_3$ in which the control signal X is asserted with the first value, the switching transistor $Q_{LS}$ begins an inverted transition from the OFF state to the ON state (that is reached at time instant $T_4$), producing mirror symmetrical operating conditions with respect to those discussed with respect to the transition $T_1$-$T_2$.

Specifically, at the time instant $T_4$, the first $S_1$, third $S_3$ and fourth $S_4$ switches in the first subset of switches $S_1$, $S_2$, $S_3$, $S_4$ are made conductive based on the drive signal S having the second value while the second switch in the second set of switches $S_2$ is made selectively non-conductive based on the drive signal S having the first value.

As exemplified in FIG. 4, the drive signal S is asserted with the first value solely at the end of such a further transition $T_3$-$T_4$, that is at the fourth time instant $T_4$. As a result, the same electrical stresses remain applied to the switching transistor $Q_{LS}$ and the associated sense transistor $M_{LS}$ of the circuit as exemplified in FIG. 1 in any one of the various possible operating conditions.

In one or more alternative embodiments, the sense transistor $M_{LS}$ and the coupling circuitry may be arranged differently while being operated in a manner substantially equal to that discussed in the foregoing with reference to FIG. 4.

Figure 5:
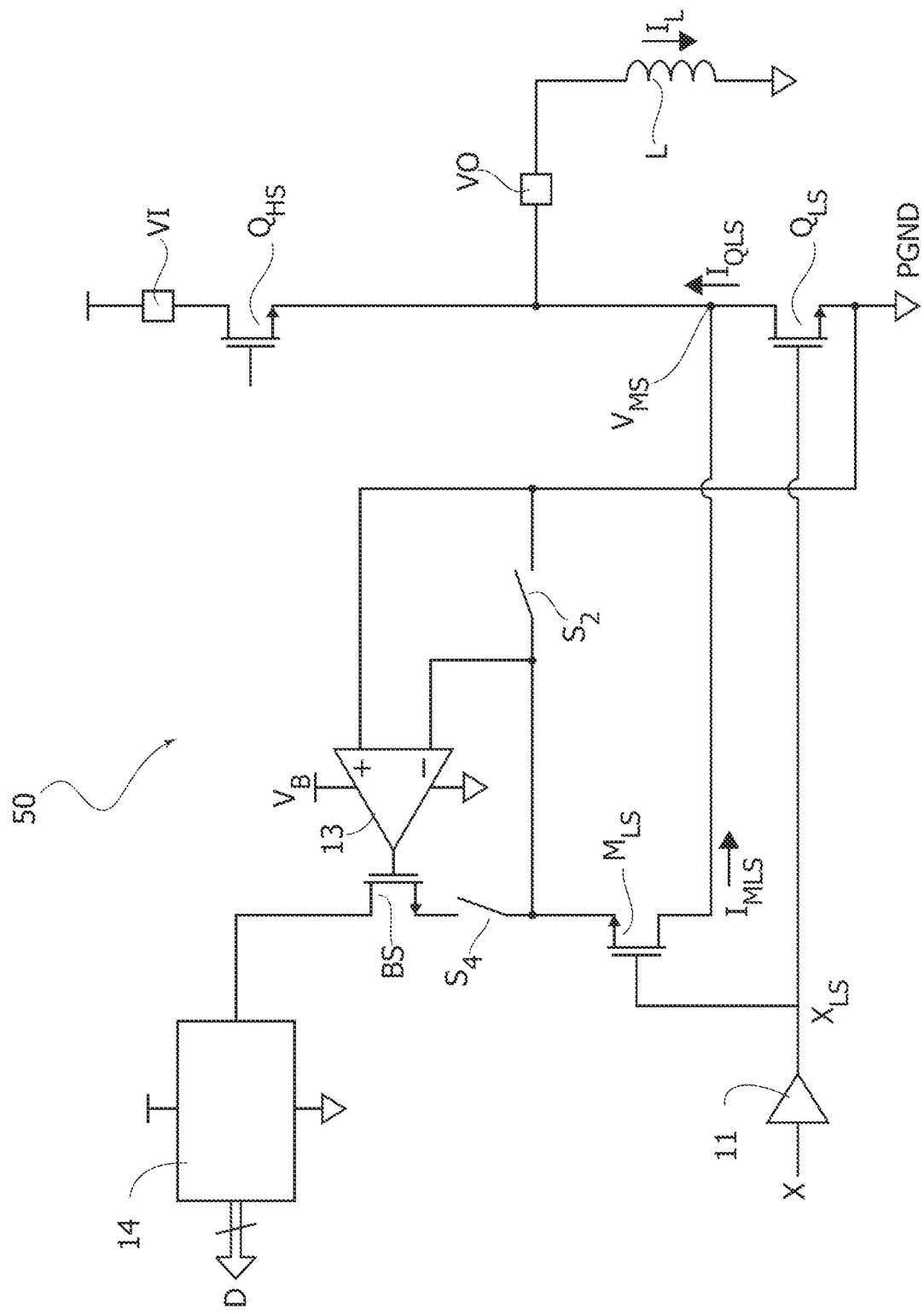
FIG. 5 is a circuit diagram exemplary of one or more alternative embodiments exemplified in FIG. 3.

As exemplified in FIG. 5, in an alternative circuit 50, for instance:

the sense transistor $M_{LS}$ is arranged with the sense node $V_{MS}$ coupled to the switching node VO of the switching transistor $Q_{LS}$ and with a further sense node (e.g., source node) coupled to the second (e.g., inverting) node of the amplifier 13 via the buffer switch BS, and the buffer circuit 13, BS has the first node coupled to ground PGND and the second node coupled to the further sense node of the sense transistor $M_{LS}$.

As exemplified in FIG. 5, for instance:

a number of switches in the first subset of switches $S_1$, $S_3$, $S_4$ may be reduced, e.g., to one single switch $S_4$ intermediate the further sense node of the sense transistor $M_{LS}$ and the buffer switch BS, the second switch $S_2$ in the second subset of switches is interposed the input nodes of the amplifier 13 in the buffer arrangement 13, BS so that they are short-circuited to ground when the switch $S_2$ is made conductive.

For instance, such an alternative embodiment as exemplified in FIG. 5 may provide a further reduced area footprint while providing similar performances in terms of robustness against stresses to the switching transistor $Q_{LS}$ and the sense transistor $M_{LS}$ associated thereto.

Figure 6:
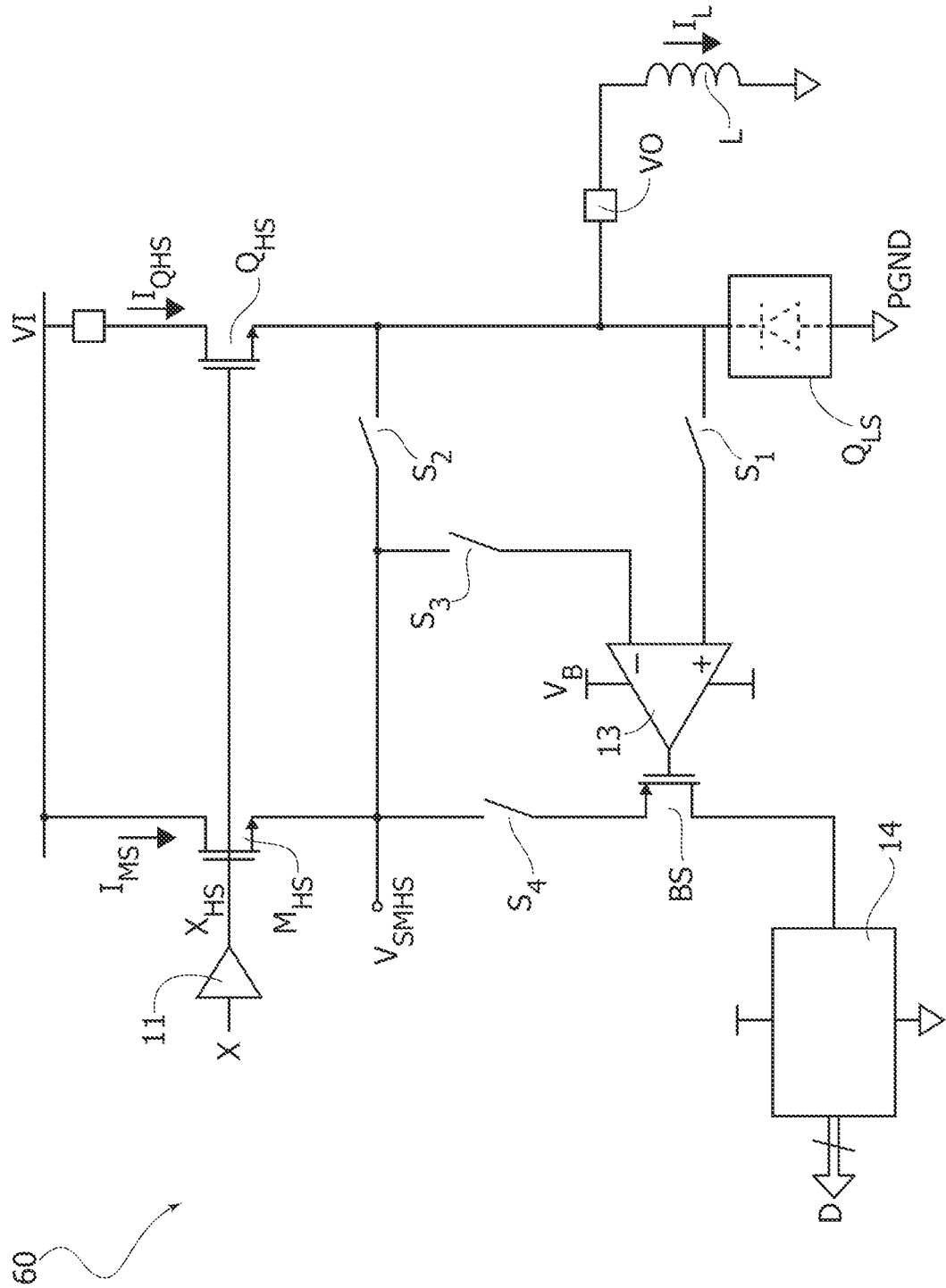
FIG. 6 is a circuit diagram exemplary of one or more embodiments.

In one or more embodiments as exemplified in FIG. 6, a further alternative circuit arrangement 60 envisages, for instance:

using the first switching transistor $Q_{LS}$ of circuit 30 exemplified in FIG. 3 as a recirculating diode coupled between the switching node VO and ground PGND in parallel with the inductor L coupled between same nodes, and driving the second switching transistor $Q_{HS}$ with control signal X received at the control node thereof.

In this alternative scenario exemplified in FIG. 6, a second sense transistor $M_{HS}$ is a down-scaled replica of second transistor $Q_{HS}$ is associated thereto, the second sense transistor $M_{HS}$ arranged with a first node (e.g., drain node) coupled to the power supply node VI, a control node coupled to the control node of the second switching transistor $Q_{HS}$ and the sense node $V_{MS}$ (e.g., the source node) configured to be coupled, alternatively:

to the switching node VO when the second subset of switches $S_2$ is made conductive, or to the buffer arrangement 13, BS when via the first subset of switches $S_1$, $S_3$, $S_4$ is made conductive.

For instance, the circuit 60 exemplified in FIG. 6 is operated according to the signals exemplified in FIG. 4 with respect to FIG. 3.

Figure 7:
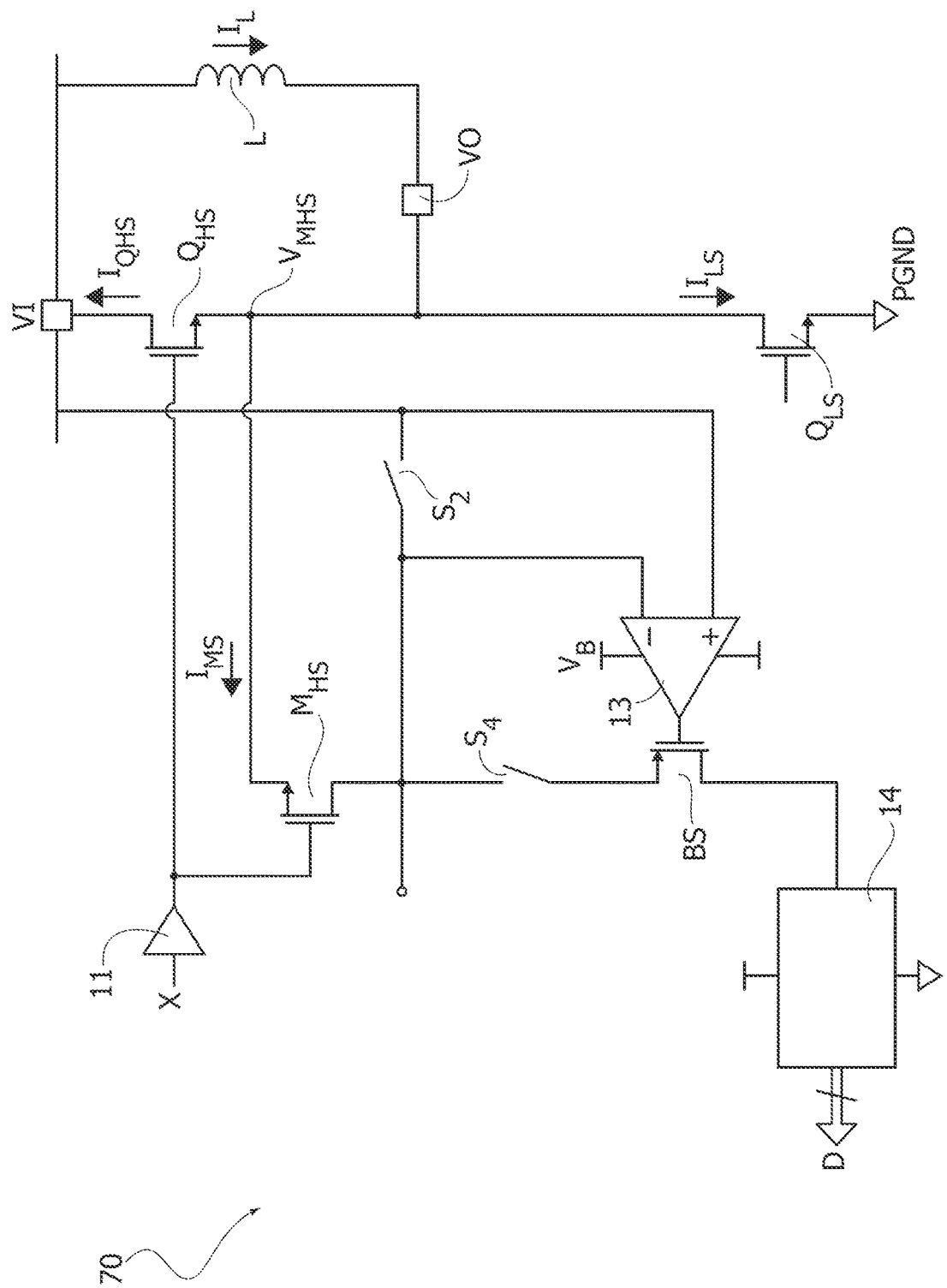
FIG. 7 is a circuit diagram exemplary of one or more alternative embodiments exemplified in FIG. 6.

In one or more alternative embodiments as exemplified in FIG. 7, for instance:

the second sense transistor $M_{HS}$ is arranged with the current path therethrough in series with the current path of the second switching transistor $Q_{HS}$, and the buffer circuit 13, BS has the first (e.g., non-inverting) node coupled to ground PGND and the second node coupled to the sense node $V_{MS}$ of the sense transistor $M_{HS}$.

As exemplified in FIG. 7, for instance:

a number of switches in the first subset of switches $S_1$, $S_3$, $S_4$ may be reduced, e.g., to one single switch $S_4$ intermediate the further sense node of the second sense transistor $M_{HS}$ and the buffer switch BS, the second switch $S_2$ in the second subset of switches is interposed the input nodes of the amplifier 13 in the buffer arrangement 13, BS so that they are short-circuited to ground when the switch $S_2$ is made conductive.

As exemplified in FIG. 8, a switched converter device in which current sensing is performed with high accuracy both on the first $Q_{LS}$ and the second $Q_{HS}$ switching transistors comprises a circuit 30 as discussed with reference to FIG. 3 and a circuit 70 as discussed with reference to FIG. 7.

Figure 8:
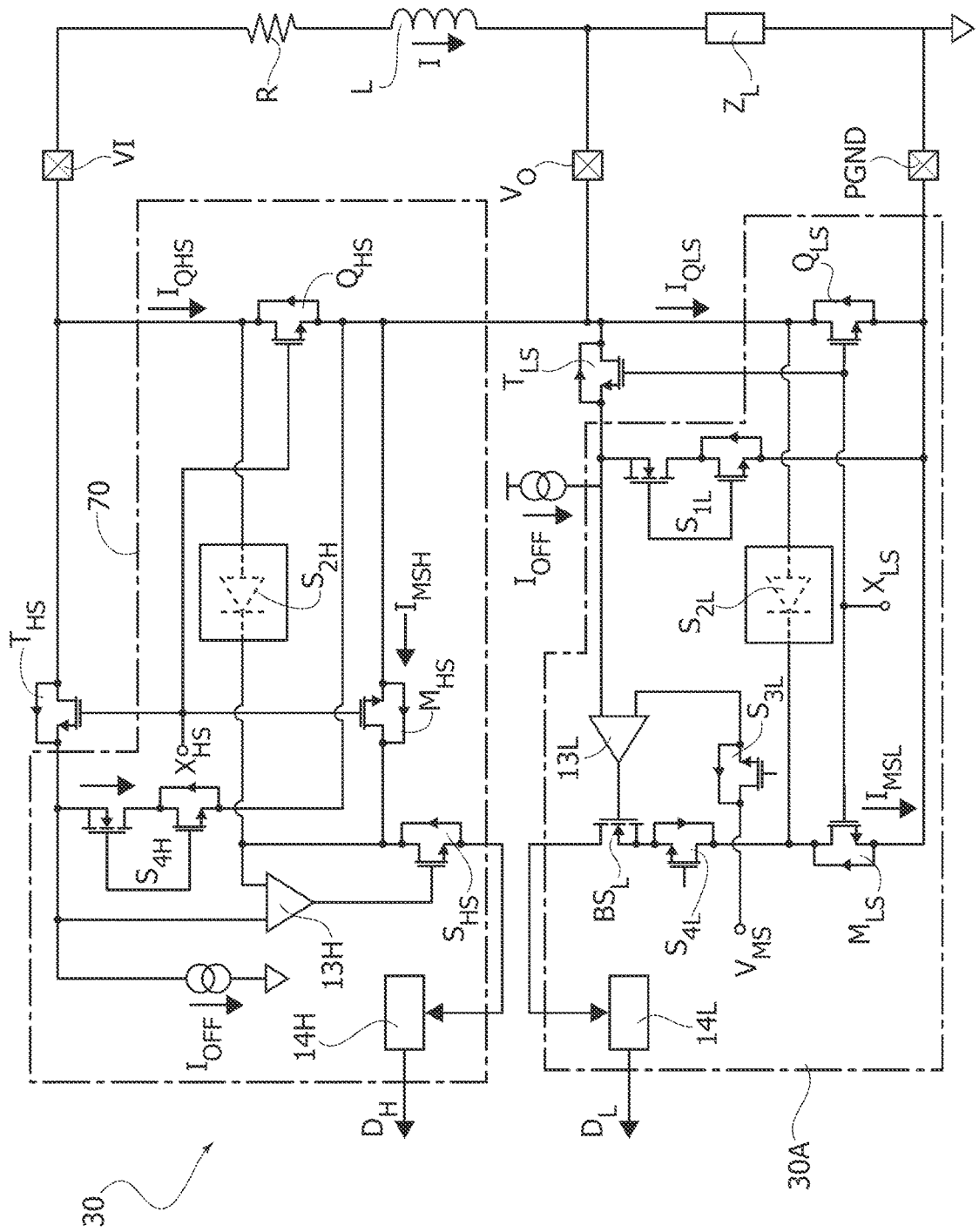
FIG. 8 is a circuit diagram exemplary of one or more embodiments.

As exemplified in FIGS. 3, 7 and 8, the first sense transistor $M_{LS}$ is a replica the first switching transistor $Q_{LS}$ and in which the second sense transistor $M_{HS}$ is a replica of the second switching transistor $Q_{HS}$.

For the sake of simplicity, reference numerals and signs of the portion of FIG. 8 that reproduces the circuit 30 exemplified in FIG. 3 are adapted to have an "L" suffix appended thereto in FIG. 8, while reference numerals and signs of the of the portion of FIG. 8 that reproduces circuit 70 exemplified in FIG. 7 are adapted to have an "H" suffix appended thereto.

As exemplified in FIG. 8, the converter circuit 80 optionally comprises first $T_{LS}$ and second $T_{HS}$ offset transistors (known per se), the first offset transistor $T_{LS}$ having a current flow path therethrough between the output node VO and the non-inverting node of the operational amplifier 13L, the second offset transistor $T_{LS}$ having a current flow path therethrough between the input node VI and the second node of the second amplifier 13H.

As exemplified in FIG. 8, an optional offset current generator $I_{OFF}$ configured to provide an offset current level is coupled to the offset transistors $T_{HS}$, $T_{LS}$, when present.

For instance, first $T_{LS}$ and second $T_{HS}$ offset transistors (together with respective offset current generators $I_{OFF}$) are configured to apply a voltage shift at the first (e.g., non-inverting) input of respective buffers 13L, 13H in order to compensate intrinsic offset of the buffer which may affect accurate sensing of drain-source voltages of the first $Q_{LS}$ and second $Q_{HS}$ power transistors, respectively, when load current values are sensibly reduced, e.g., close to 0 Ampere. For instance, in a scenario in which load current is close to zero, for instance, the voltage drop across power transistors $Q_{LS}$, $Q_{HS}$ is also close to ground level, so that an intrinsic negative offset of buffers 13L, 13H may force the current sense structure to sense a negative voltage on drain/source terminals which the buffer is not able to track. In such a situation, for instance, first $T_{LS}$ and second $T_{HS}$ offset transistors are designed to apply a positive voltage shift higher than the intrinsic offset of the buffers 13L, 13H.

In one or more embodiments in which these optional offset compensation components $T_{LS}$, $T_{HS}$, $I_{OFF}$ are present, the set of switches $S_1$, $S_2$, $S_3$ and $S_4$ facilitates applying same stresses HCI and HTRB also to these components, improving overall circuit performance avoiding mismatches.

Figure 9:
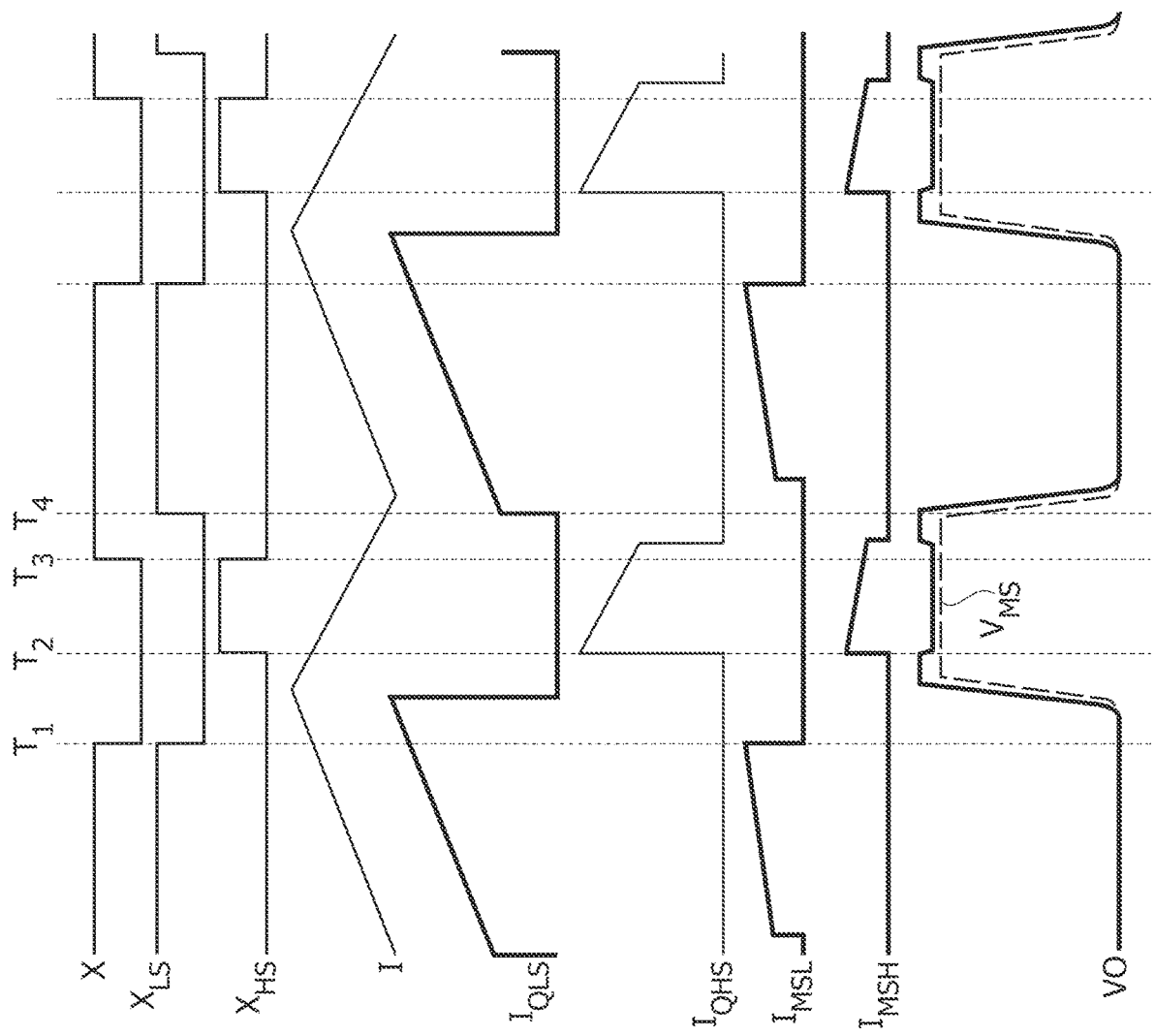
FIG. 9 is a time diagram of signals of one or more embodiments according to FIG. 8.

As exemplified in FIG. 9, operating the circuit 80 comprises:

at a first time instant $T_1$, the first $S_{1L}$, third $S_{3L}$ and fourth $S_{3L}$ switches in the first set of switches $S_{1L}$, $S_{2L}$, $S_{3L}$, $S_{4L}$ of the circuit 30 are made non-conductive based on the first drive signal $X_{LS}$ having a first (e.g., falling) edge and remain turned OFF as long as the first drive signal $X_{LS}$ has a first (e.g., "0") value;

at the same first time instant $T_1$, the second switch $S_{2L}$ in the circuit 30 is made selectively conductive based on the first drive signal $X_{LS}$ having a first (e.g., falling) edge and remain turned ON as long as the first drive signal $X_{LS}$ has the first (e.g., "0") value;

at a subsequent time instant $T_2$, the first $S_{1H}$, third $S_{3H}$ and fourth $S_{4H}$ switches in the circuit 70 are made conductive based on the second drive signal $X_{HS}$ having a second (e.g., rising) edge and remain turned ON as long as the second drive signal $X_{HS}$ has a second (e.g., "1") value; concurrently, still at the time instant $T_2$, the second switch $S_{2H}$ in circuit 70 is made selectively non-conductive based on the second drive signal $X_{HS}$ having a second (e.g., rising) edge and remain turned ON as long as the second drive signal $X_{HS}$ has the second (e.g., "1") value.

In a circuit as exemplified herein, first and/or second sensing current $I_{MSL}$, $I_{MSH}$ provided at ADC input is/are proportional to the respective first and/or second current(s) $I_{QLS}$, $I_{QHS}$ in the respective first and/or second switching transistors $Q_{LS}$, $Q_{HS}$ with a stable scale factor, independent from fabrication process spread, temperature and aging phenomena occurring during various ON/OFF steps during the operating life of the circuit 80.

As exemplified in FIG. 8, a switched converter device 80, comprises: a circuit as exemplified in any of FIGS. 3 to 7, an inductive load L coupled between the intermediate node VO and the reference node VI, PGND, a battery configured to provide a voltage supply level to said reference node VI, PGND or a ground node configured to provide a ground voltage level to said reference node VI, PGND, and control circuitry 12 configured to provide the control signal $X_{LS}$, $X_{HS}$.

A circuit as exemplified in any of FIGS. 3 to 9 comprises: at least one switching transistor $Q_{LS}$, $Q_{HS}$ having a first terminal configured to receive a control signal $X_{LS}$, $X_{HS}$ as well as a current flow path therethrough between a second terminal VO and a third terminal PGND, VI of the at least one switching transistor. For instance, the at least one switching transistor is configured to be switched towards a conductive state in response to the respective control signal having a first value wherein the current flow path through the at least one switching transistor provides a current flow line $I_{QLS}$, $I_{QHS}$ between a switching circuit node VO and a reference node VI, PGND. In the circuit as exemplified herein, the at least one switching transistor in the conductive state has a conduction voltage drop between the second VO and third VI, PGND terminals and is configured to be switched towards a non-conductive state in response to the respective control signal having a second value, wherein, in the non-conductive state, a stress voltage drop is applied between the second and third terminals of the at least one switching transistor.

As exemplified in any of FIGS. 3 to 9, the circuit further comprises a sense transistor $M_{LS}$, MSH coupled to the at least one switching transistor and configured to provide a scaled replica thereof, the sense transistor having a current sense flow path therethrough wherein the intensity of the current $I_{MS}$ flowing in the current sense flow path of the sense transistor is indicative of the intensity of the current $I_{QLS}$, $I_{QHS}$ flowing in the current flow path through the at least one switching transistor.

As exemplified in any of FIGS. 3 to 9, the circuit further comprises coupling circuitry 13, SB, $S_1$, $S_2$, $S_3$, $S_4$ of the sense transistor to the least one switching transistor, the coupling circuitry configured to apply the stress voltage drop across the sense transistor in response to the at least one switching transistor being switched towards the non-conductive state, wherein, in response to the at least one switching transistor being switched towards the non-conductive state, the stress voltage drop is replicated across both the at least one switching transistor and across the sense transistor.

As exemplified in any of FIGS. 3 to 8, the sense transistor $M_{LS}$, $M_{SH}$ comprises a junction area which is 1/N times the junction area of the at least one switching transistor $Q_{LS}$, $Q_{HS}$, wherein the current $I_{MS}$ flowing in the current sense flow path of the sense transistor is 1/N times the intensity of the current $I_{QLS}$, $I_{QHS}$ flowing in the current flow path through the at least one switching transistor.

As exemplified in any of FIGS. 3, 6 and 8, the sense transistor $M_{LS}$, $M_{SH}$ has a first sense terminal coupled to the first terminal of the at least one switching transistor $Q_{LS}$, $Q_{HS}$ as well as the current sense flow path therethrough between a second sense terminal $V_{MS}$ and a third sense terminal of the sense transistor, wherein the first sense terminal of the sense transistor is coupled to the first terminal of the at least one switching transistor and the third sense terminal of the sense transistor is coupled to the third terminal PGND, VI of the at least one switching transistor.

As exemplified in any of FIGS. 5, 7 and 8, the sense transistor $M_{LS}$, $M_{SH}$ has a first sense terminal coupled to the first terminal of the at least one switching transistor $Q_{LS}$, $Q_{HS}$ as well as the current sense flow path therethrough between a second sense terminal $V_{MS}$ and a third sense terminal of the sense transistor, wherein the sense transistor has the first sense terminal coupled to the first terminal of the at least one switching transistor and the second sense terminal is coupled to the second terminal of the at least one switching transistor.

As exemplified in any of FIGS. 3 to 9, the coupling circuitry 13, SB, $S_1$, $S_2$, $S_3$, $S_4$ comprises an amplifier circuit 13 configured to:
be coupled $S_1$, $S_2$, $S_3$, $S_4$ to the at least one switching transistor and to the sense transistor, the amplifier circuit 13 configured to sense the conduction voltage drop between the second VO and third VI, PGND terminals of the at least one switching transistor in the conductive state, and
be decoupled $S_1$, $S_2$, $S_3$, $S_4$ from the sense transistor and from the at least one switching transistor in the non-conductive state.

As exemplified in any of FIGS. 3, 6 and 8, the coupling circuitry 13, SB, $S_1$, $S_2$, $S_3$, $S_4$ comprises an amplifier circuit 13 configured to sense $S_1$, $S_3$, $S_4$ the conduction voltage drop between the second VO and third VI, PGND terminals of the at least one switching transistor in the conductive state, the amplifier circuit 13 having a feedback loop BS configured to replicate the conduction voltage drop between the second VO and third VI, PGND terminals of the at least one switching transistor across the second sense terminal $V_{MS}$ and the third sense terminal of the sense transistor.

Figure 10:
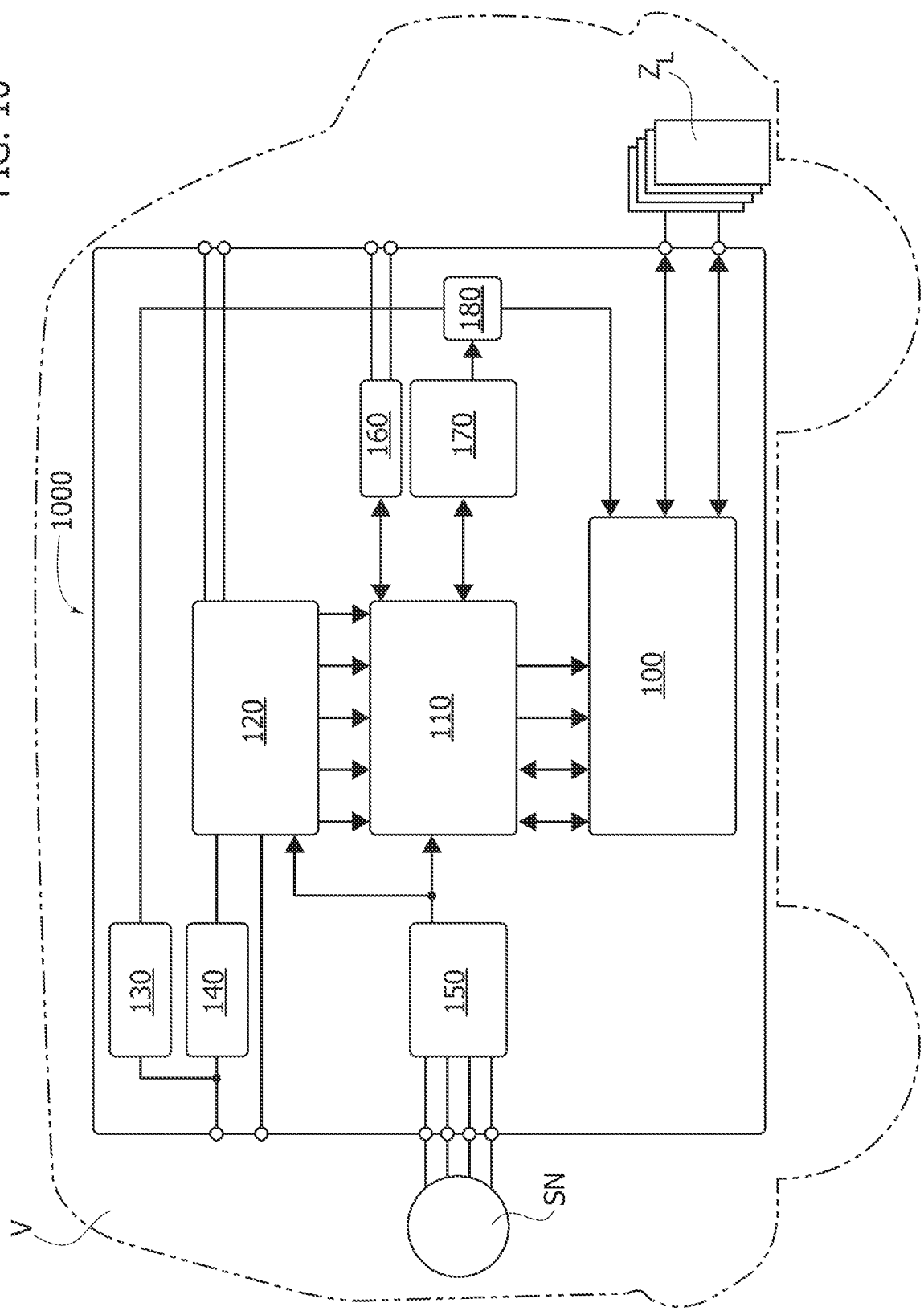
FIG. 10 is a diagram exemplary of a system according to one or more embodiments.

As exemplified in FIG. 10, a control unit (e.g., controller) 1000 comprises:
at least one switched electronic converter 80 or at least one circuit according to the present disclosure,
a micro-controller 110 coupled to the circuit and configured to provide thereto the control signal $X_{LS}$, $X_{HS}$,
at least one load $Z_L$ configured to be coupled to the circuit to receive a regulated output voltage VO therefrom.

As exemplified herein, the control unit is mounted onboard a vehicle V, preferably an electrically powered automotive vehicle.

As exemplified in FIG. 10, a telematic control unit (briefly, TCU) 1000 equipped on-board a (e.g., wheeled and/or autonomous and/or electrically powered) vehicle V comprises a micro-chip 100, e.g., for braking applications, including the first 30A and/or second 30B sensing circuits.

For instance, the TCU 1000 further comprises:
a micro-controller 110 coupled to the micro-chip 100,
a system basis chip 120 coupled to the micro-controller 110,
reverse battery protection circuits 130, 140 coupled to the system basis chip 120 and configured to be coupled to an electric battery of the vehicle V,
a signal processing unit (e.g., signal processor) 150 configured to be coupled to sensors SN (e.g., inertial measurement units) onboard the vehicle and to the micro-processor 110 to provide sensor signals thereto,
a transceiver unit (e.g., transceiver) 160, e.g., a CAN/flex-ray unit known per se,
a system companion chip (briefly, SCC) 170, known per se,
common driver stages 180 configured to be coupled to the micro-chip 100 (e.g., based on a "bank" principle or one for each channel), and
a plurality of load circuits $Z_L$ configured to be coupled to the micro-chip 100.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
   at least one switching transistor including:
      a first terminal configured to receive a control signal; and
      second and third terminals, wherein the at least one switching transistor is configured to:
         selectively provide a first path for a first current, the first path being between the second and third terminals;
         in response to the control signal having a first value, switch to a conductive state in which the first path enables the first current to flow through the at least one switching transistor between a node and a reference node, wherein in the conductive state, the at least one switching transistor has a conduction voltage drop between the second and third terminals; and
         in response to the control signal having a second value, switch to a non-conductive state, wherein in the non-conductive state, a stress voltage drop is applied between the second and third terminals of the at least one switching transistor;
   a sense transistor coupled to the at least one switching transistor and configured to:
      provide a scaled replica of the at least one switching transistor;
      selectively provide a second path for a sense current through the sense transistor, wherein the sense current is indicative of the first current; and
   coupling circuitry configured to:
      in response to the at least one switching transistor being switched to the non-conductive state, apply the stress voltage drop across the sense transistor, wherein in response to the at least one switching transistor being switched to the non-conductive state, the stress voltage drop is replicated across both the at least one switching transistor and across the sense transistor.

2. The circuit of claim 1, wherein the sense transistor includes:
   a junction area that is 1/N times a junction area of the at least one switching transistor, wherein the sense current is 1/N times the first current.

3. The circuit of claim 1, wherein the sense transistor includes:
   a first sense terminal coupled to the first terminal of the at least one switching transistor;
   a second sense terminal; and
   a third sense terminal coupled to the third terminal of the at least one switching transistor, wherein the second path for the sense current is between the second and third sense terminals.

4. The circuit of claim 1, wherein the sense transistor includes:
   a first sense terminal coupled to the first terminal of the at least one switching transistor;
   a second sense terminal is coupled to the second terminal of the at least one switching transistor; and
   a third sense terminal, wherein the second path for the sense current is between the second and third sense terminals.

5. The circuit of claim 1, wherein the coupling circuitry includes an amplifier circuit configured to:
   be coupled to the at least one switching transistor and the sense transistor;
   sense the conduction voltage drop between the second and third terminals of the at least one switching transistor in the conductive state; and
   be decoupled from the sense transistor and from the at least one switching transistor in the non-conductive state.

6. The circuit of claim 3, wherein the coupling circuitry includes an amplifier circuit configured to:
   sense the conduction voltage drop between the second and third terminals of the at least one switching transistor in the conductive state, wherein the amplifier circuit has a feedback loop configured to replicate the conduction voltage drop between the second and third terminals of the at least one switching transistor across the second sense terminal and the third sense terminal of the sense transistor.

7. A switched converter, comprising:
   a circuit including:
      at least one switching transistor including:
         a first terminal configured to receive a control signal; and
         second and third terminals, wherein the at least one switching transistor is configured to:
            selectively provide a first path for a first current, the first path being between the second and third terminals;
            in response to the control signal having a first value, switch to a conductive state in which the first path enables the first current to flow through the at least one switching transistor between a switching circuit node and a reference node, wherein in the conductive state, the at least one switching transistor has a conduction voltage drop between the second and third terminals; and
            in response to the control signal having a second value, switch to a non-conductive state, wherein in the non-conductive state, a stress voltage drop is applied between the second and third terminals of the at least one switching transistor;
      a sense transistor coupled to the at least one switching transistor and configured to:
         provide a scaled replica of the at least one switching transistor; and
         selectively provide a second path for a sense current through the sense transistor, wherein the sense current is indicative of the first current; and
      coupling circuitry configured to:

in response to the at least one switching transistor being switched to the non-conductive state, apply the stress voltage drop across the sense transistor, wherein in response to the at least one switching transistor being switched to the non-conductive state, the stress voltage drop being replicated across both the at least one switching transistor and across the sense transistor;

an inductive load coupled between the switching circuit node and the reference node;

a battery configured to provide a supply voltage to the reference node or a ground node configured to provide a ground voltage level to the reference node; and control circuitry configured to output the control signal.

8. The switched converter of claim 7, wherein the sense transistor includes:
a junction area that is 1/N times a junction area of the at least one switching transistor, wherein the sense current is 1/N times the first current.

9. The switched converter of claim 7, wherein the sense transistor includes:
a first sense terminal coupled to the first terminal of the at least one switching transistor;
a second sense terminal; and
a third sense terminal coupled to the third terminal of the at least one switching transistor, wherein the second path for the sense current is between the second and third sense terminals.

10. The switched converter of claim 7, wherein the sense transistor includes:
a first sense terminal coupled to the first terminal of the at least one switching transistor;
a second sense terminal is coupled to the second terminal of the at least one switching transistor; and
a third sense terminal, wherein the second path for the sense current is between the second and third sense terminals.

11. The switched converter of claim 7, wherein the coupling circuitry includes an amplifier circuit configured to:
be coupled to the at least one switching transistor and the sense transistor;
sense the conduction voltage drop between the second and third terminals of the at least one switching transistor in the conductive state; and
be decoupled from the sense transistor and from the at least one switching transistor in the non-conductive state.

12. The switched converter of claim 9, wherein the coupling circuitry includes an amplifier circuit configured to:
sense the conduction voltage drop between the second and third terminals of the at least one switching transistor in the conductive state, wherein the amplifier circuit has a feedback loop configured to replicate the conduction voltage drop between the second and third terminals of the at least one switching transistor across the second sense terminal and the third sense terminal of the sense transistor.

13. A controller, comprising:
a circuit including:
at least one switching transistor including:
a first terminal configured to receive a control signal; and
second and third terminals, wherein the at least one switching transistor is configured to:
selectively provide a first path for a first current, the first path being between the second and third terminals;
in response to the control signal having a first value, switch to a conductive state in which the first path enables the first current to flow through the at least one switching transistor between a switching circuit node and a reference node, wherein in the conductive state, the at least one switching transistor has a conduction voltage drop between the second and third terminals; and
in response to the control signal having a second value, switch to a non-conductive state, wherein in the non-conductive state, a stress voltage drop is applied between the second and third terminals of the at least one switching transistor;

a sense transistor coupled to the at least one switching transistor and configured to:
provide a scaled replica of the at least one switching transistor; and
selectively provide a second path for a sense current through the sense transistor, wherein the sense current is indicative of the first current; and
coupling circuitry configured to:
in response to the at least one switching transistor being switched to the non-conductive state, apply the stress voltage drop across the sense transistor, wherein in response to the at least one switching transistor being switched to the non-conductive state, the stress voltage drop being replicated across both the at least one switching transistor and across the sense transistor;

a microcontroller coupled to the circuit and configured to output the control signal to the circuit; and at least one load configured to be coupled to the circuit and receive a regulated output voltage from the circuit.

14. The controller of claim 13, wherein the sense transistor includes:
a junction area that is 1/N times a junction area of the at least one switching transistor, wherein the sense current is 1/N times the first current.

15. The controller of claim 13, wherein the sense transistor includes:
a first sense terminal coupled to the first terminal of the at least one switching transistor;
a second sense terminal; and
a third sense terminal coupled to the third terminal of the at least one switching transistor, wherein the second path for the sense current is between the second and third sense terminals.

16. The controller of claim 13, wherein the sense transistor includes:
a first sense terminal coupled to the first terminal of the at least one switching transistor;
a second sense terminal is coupled to the second terminal of the at least one switching transistor; and
a third sense terminal, wherein the second path for the sense current is between the second and third sense terminals.

17. The controller of claim 13, wherein the coupling circuitry includes an amplifier circuit configured to:
be coupled to the at least one switching transistor and the sense transistor;

sense the conduction voltage drop between the second and third terminals of the at least one switching transistor in the conductive state; and be decoupled from the sense transistor and from the at least one switching transistor in the non-conductive state.

18. The controller of claim 15, wherein the coupling circuitry includes an amplifier circuit configured to:

sense the conduction voltage drop between the second and third terminals of the at least one switching transistor in the conductive state, wherein the amplifier circuit has a feedback loop configured to replicate the conduction voltage drop between the second and third terminals of the at least one switching transistor across the second sense terminal and the third sense terminal of the sense transistor.

19. The controller of claim 13, wherein the controller is mounted onboard a vehicle.

20. The controller of claim 19, wherein the vehicle is an electrically powered automotive vehicle.

* * * * *